(12) United States Patent
Dames et al.

(10) Patent No.: US 11,784,011 B2
(45) Date of Patent: Oct. 10, 2023

(54) ELECTRICITY METER WITH ELECTRICALLY-CONTROLLED ELECTROMECHANICAL SWITCH

(71) Applicant: Sentec Ltd., Cambridge (GB)

(72) Inventors: Andrew Nicholas Dames, Cambridge (GB); Michael Cantor, Cambridge (GB); Lawrence Born, Hitchen (GB); James Evett, Winslow (GB)

(73) Assignee: SENTEC LTD., Cambridge (GB)

( * ) Notice: Subject to any disclaimer, the term of this patent is extended or adjusted under 35 U.S.C. 154(b) by 0 days.

(21) Appl. No.: 17/505,871

(22) Filed: Oct. 20, 2021

(65) Prior Publication Data

US 2022/0246367 A1 Aug. 4, 2022

Related U.S. Application Data

(63) Continuation of application No. 16/293,004, filed on Mar. 5, 2019, now abandoned.

(30) Foreign Application Priority Data

Mar. 7, 2018 (GB) ...................... 1803630

(51) Int. Cl.
*H01H 3/26* (2006.01)
*G01R 11/24* (2006.01)
(Continued)

(52) U.S. Cl.
CPC ............... *H01H 3/26* (2013.01); *G01R 11/24* (2013.01); *H01H 3/42* (2013.01); *H01H 3/46* (2013.01); *H01H 2003/326* (2013.01)

(58) Field of Classification Search
CPC .................................. H01H 3/26; H01H 3/46
(Continued)

(56) References Cited

U.S. PATENT DOCUMENTS 2,628,272 A 2/1953 Gille
3,158,796 A * 11/1964 Musgrave ............... H01F 7/145
307/328
(Continued)

FOREIGN PATENT DOCUMENTS

CN 201650914 U 11/2010
DE 3225830 A1 1/1984
(Continued)

OTHER PUBLICATIONS

English language Abstract of CN201650914U.
(Continued)

*Primary Examiner* — Alexander Talpalatski
(74) *Attorney, Agent, or Firm* — Ware, Fressola, Maguire & Barber LLP

(57) ABSTRACT

An electricity meter comprising an electrically-controlled electromechanical switch is disclosed. The electromechanical switch comprises a rotary actuator comprising a generally-cylindrical permanent magnet rotor having a central axis, a stator comprising a closed stator core and first and second opposite stator poles inwardly-projecting from the closed stator core towards the rotor and first and second coils wound around the first and second stator poles respectively. The electromechanical switch comprises a switch comprising at least one pair of first and second contacts wherein the first contact is movable. The electromechanical switch comprises mechanical linkage between the rotary actuator and the movable contact(s) configured such that rotation of the rotor from a first angular position to a second angular position causes the switch to be opened, and rotation from the second angular position to the first angular position causes the switch to be closed.

21 Claims, 15 Drawing Sheets

(51) Int. Cl.
*H01H 3/42* (2006.01)
*H01H 3/46* (2006.01)
*H01H 3/32* (2006.01)

(58) Field of Classification Search
USPC .......................................................... 335/234
See application file for complete search history.

(56) References Cited

U.S. PATENT DOCUMENTS

| | | | |
|---|---|---|---|
| 4,227,164 A * | 10/1980 | Kitahara | H01F 7/145 |
| | | | 310/36 |
| 4,287,457 A * | 9/1981 | Takemura | H02K 33/16 |
| | | | 318/132 |
| 5,004,080 A | 4/1991 | Wada | |
| 5,275,141 A | 1/1994 | Tsunoda et al. | |
| 5,708,406 A | 1/1998 | Tsunoda et al. | |
| 6,674,349 B1 | 1/2004 | Bolongeat et al. | |
| 7,804,386 B2 * | 9/2010 | Yonnet | F01L 9/20 |
| | | | 335/229 |
| 8,212,432 B2 | 7/2012 | Hart et al. | |
| 8,476,996 B2 * | 7/2013 | Liang | H01H 51/2263 |
| | | | 335/78 |
| 9,917,496 B2 * | 3/2018 | Nelson | H02K 33/16 |
| 2009/0261805 A1 | 10/2009 | Shuey | |
| 2012/0049987 A1 * | 3/2012 | Liang | H01H 51/2263 |
| | | | 335/80 |
| 2013/0076185 A1 | 3/2013 | Benner, Jr. | |
| 2014/0218143 A1 | 8/2014 | Gruden | |

FOREIGN PATENT DOCUMENTS

| | | | |
|---|---|---|---|
| EP | 3038124 A1 | 6/2016 | |
| GB | 2477604 A | 8/2011 | |
| JP | 02280694 A | 11/1990 | |
| JP | 2010102932 A | 5/2010 | |
| WO | 2010048993 A1 | 5/2010 | |

OTHER PUBLICATIONS

English language Abstract of DE3225830A1.
English language Abstract of JP2010102932A.
English language Abstract of JPH02280694A.

* cited by examiner

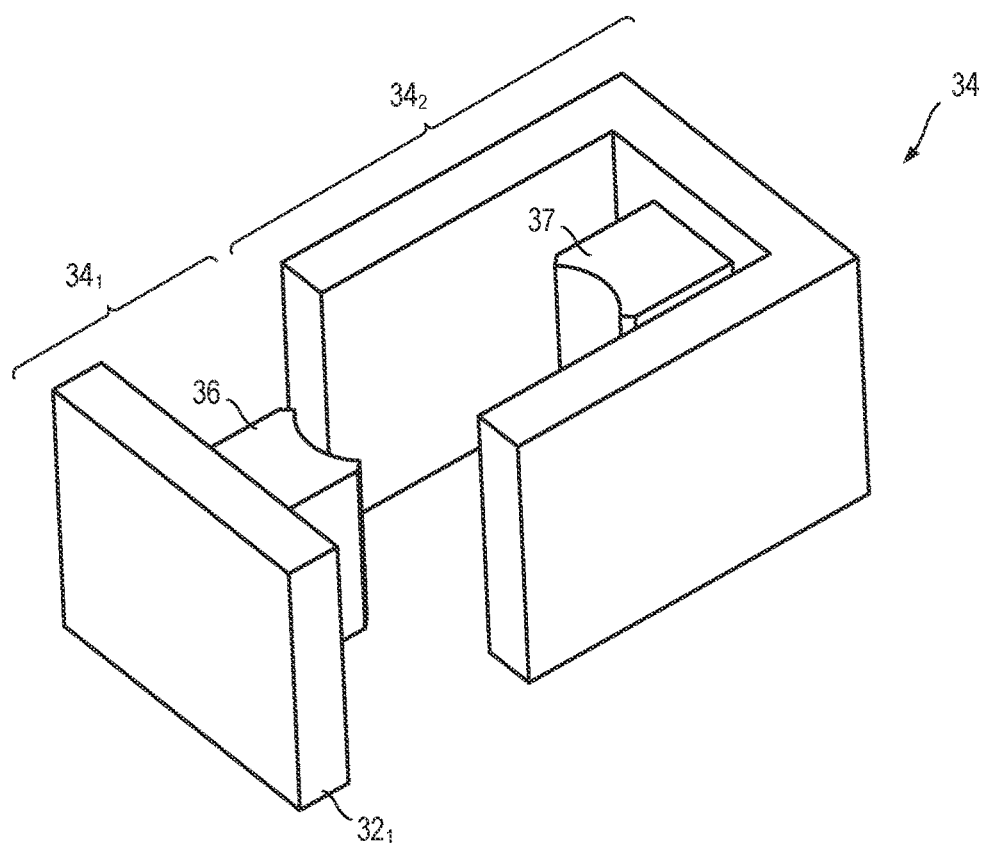
Fig. 6
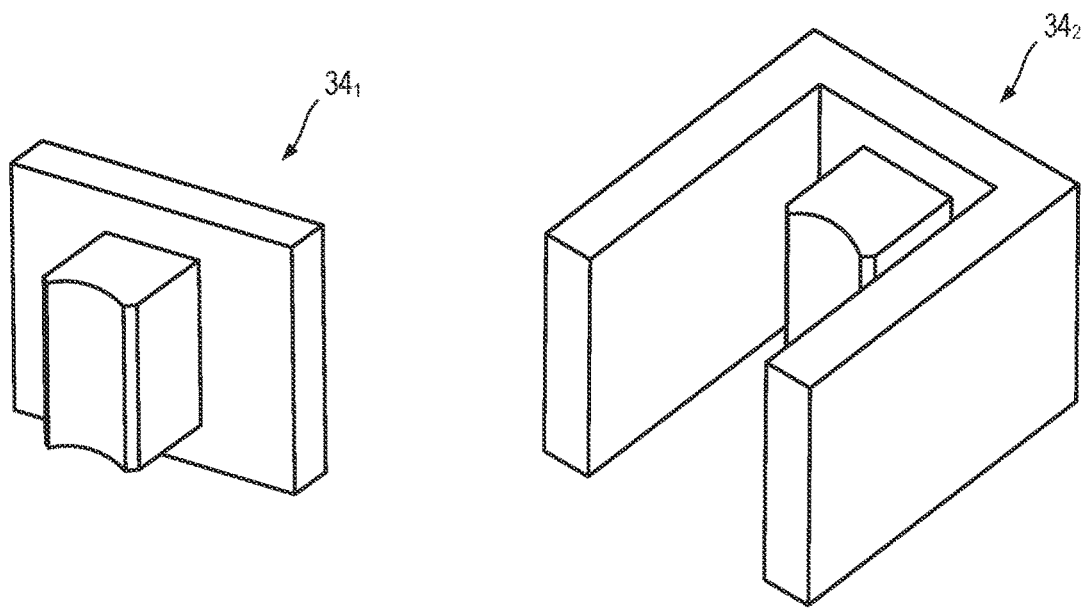
Fig. 7                    Fig. 8

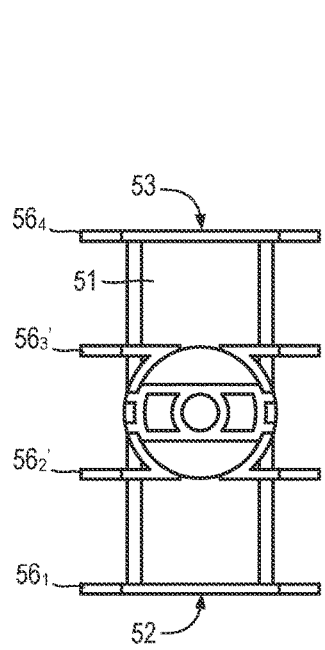 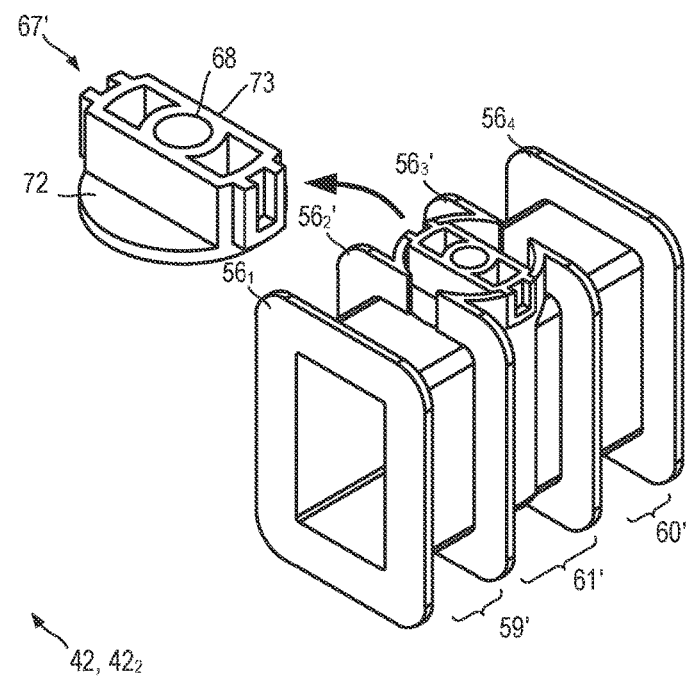
Fig. 14a  Fig. 15a
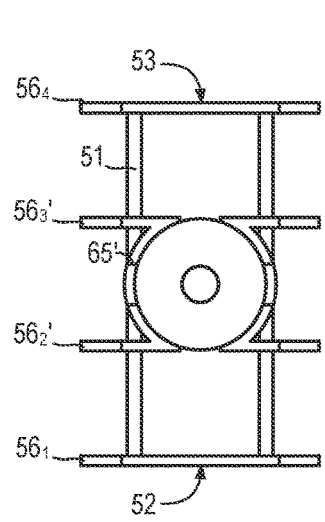 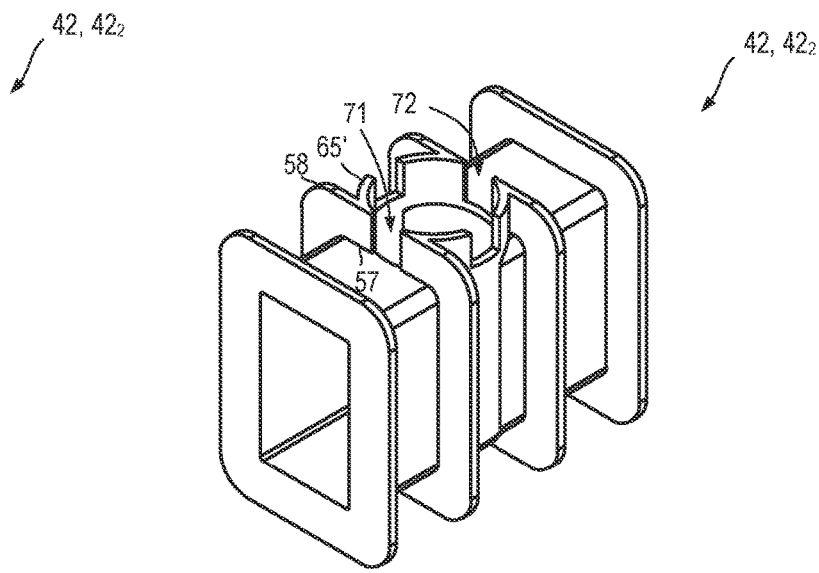
Fig. 14b  Fig. 15b

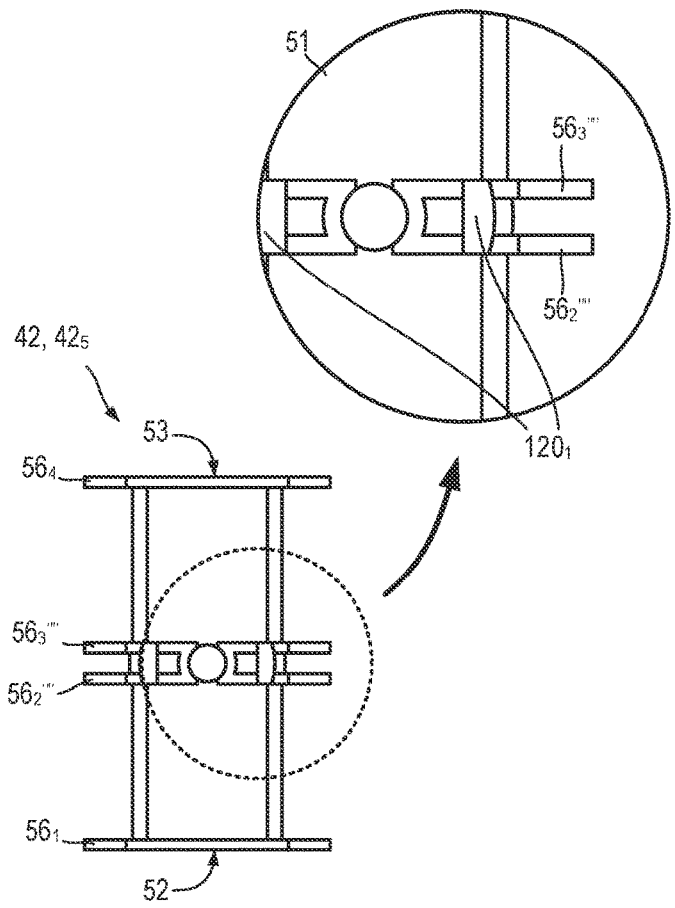
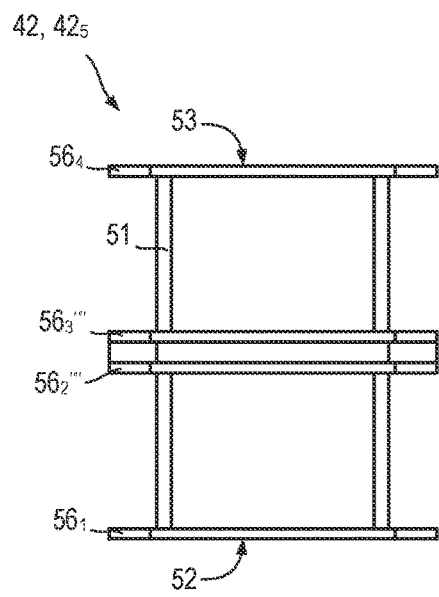
Fig. 22    Fig. 23
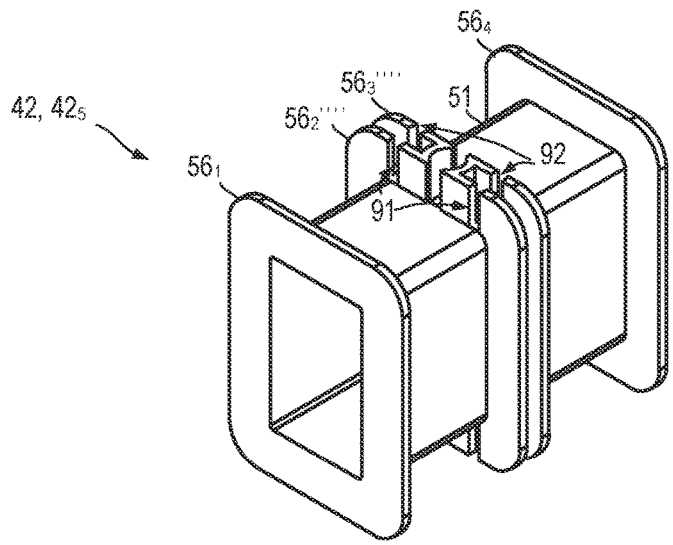
Fig. 24

SECTION A-A

SECTION B-B

ELECTRICITY METER WITH ELECTRICALLY-CONTROLLED ELECTROMECHANICAL SWITCH

CROSS REFERENCE TO RELATED APPLICATIONS

This application is a continuation of, and claims benefit to, U.S. application Ser. No. 16/293,004, filed 5 Mar. 2019, which claims benefit to UK application no. 1803630.1, filed 7 Mar. 2018.

FIELD OF THE INVENTION

The present invention relates to an electricity meter which comprises an electrically-controlled electromechanical switch comprising a rotary actuator.

BACKGROUND

Domestic and commercial electricity meters can be provided with remotely-controllable disconnector modules for disconnecting and reconnecting the electricity supply. An example of such an electricity meter can found in WO 2010/048993 A1.

US 2012/049987 A1 describes a latching relay which could be used as a disconnect switch in a domestic electricity meter.

The latching relay contact may be liable to tamper by the use of external magnetic fields.

SUMMARY

Accordingly, the present specification relates to an electricity meter with an electrically-controlled electromechanical switch. Its rotary actuator employs a fully enclosed stator and small magnet which can make the actuator particularly compact, and therefore can make it highly immune to external magnetic tamper fields.

The small actuator size can enable low material costs, and can make the actuator fast, which in turn reduces the resistance energy losses in the actuation coils. Reducing energy usage can reduce drive electronics cost.

The design of the bobbin disclosed can reduce the component count, whilst broadening the permissible tolerances thus can reduce cost further.

In addition the use of a single piece bobbin precisely located within the stator, and the use of the bobbin to locate the actuator rotor can enable the working air gap between the rotor and the stator poles to be reduced, which again improves energy efficiency.

The present specification also relates means of increasing the space for the actuation coils without increasing the actuator size which further reduces the actuation energy.

The increased space for the actuation coils encloses the actuators working air gaps and to some extent the rotor, which is additionally advantageous as it reduces flux leakage.

The aforementioned arrangement can help to maintain the compact form of the actuator, which can reduce flux pickup and susceptibility to magnetic tampering.

According to a first aspect of the present invention there is provided an electricity meter. The electricity meter comprises an electrically-controlled electromechanical switch. The electromechanical switch comprises a rotary actuator comprising a permanent magnet rotor having a central axis, a stator comprising a closed stator core and first and second opposite stator poles inwardly-projecting from the closed stator core towards the rotor and first and second coils wound around the first and second stator poles respectively. The electromechanical switch comprises a switch comprising at least one pair of first and second contacts wherein the first contact is movable. The electromechanical switch comprises mechanical linkage between the rotary actuator and the movable contact(s) configured such that rotation of the rotor from a first angular position to a second angular position causes the switch to be opened, and rotation from the second angular position to the first angular position causes the switch to be closed.

The electromechanical switch may further comprise a bobbin. The bobbin may comprise a wall extending between first and second ends defining a lumen including first, second and third sections between the first and second ends, wherein the first and second sections are for receiving the first and second stator poles respectively through respective first and second openings at the first and second ends respectively, and wherein the third section is interposed between the first and second sections for receiving the rotor, introducible through the first or second openings or through a third opening in the wall of the bobbin and first, second, and third flanges and, optionally, a fourth flange spaced apart between the first and second ends defining fourth and fifth sections for forming the first and second coils.

The bobbin may be single-piece. The bobbin may be configured to partly or fully position the rotor with respect to the first and second stator poles. The bobbin may be configured to position the rotor with respect to the first and second stator poles (either directly or indirectly). The bobbin may be configured to provide a bearing for a shaft for the rotor.

The electricity meter may further comprise a bush. The third opening may be configured to receive the bush such that, after the rotor is disposed in the third section, the bush plugs the third opening and provides a bearing for the shaft for the rotor. The bush may comprise a disk-shaped base having a diameter and a mesa having a width narrower than the diameter extending across the base. The inner two flanges (e.g., when there are four flanges, the second and third flanges) may include first and second gaps and the bush may be configured to at least partly fill the gaps.

This can allow the second and third flanges to be located closer to the centre of the bobbin and, thus, for the coil to extend closer to the centre of the bobbin and so increase the number of windings and, thus, the force for a given current. The gaps can allow the rotor and/or the bush to be inserted without interfering with the second and third flanges.

The coil(s) may partly overlap(s)/enclose(s) the air gap. The coil(s) may partly overlaps/encloses the magnet.

The mesa has first and second sides and the second and third flanges may include first and second gaps and the first and second sides of the mesa is configured so it may at least partly fill the gaps.

This can allow the second and third flanges to be located closer to the centre of the bobbin and, thus, for the coil to extend closer to the centre of the bobbin and so increase the number of windings and, thus, the force for a given current. For example, this can increase the number of winding by at least 10%, at least 30% or by at least 40% or more compared to a bobbin where the second and third flanges are continuous and spaced apart from each other by a distance sufficient to allow the rotor and/or the bush to fit between the inner two of four flanges.

The bobbin may include first and second surfaces for providing bearings for a shaft supporting the rotor.

The third and second flanges are separated by at least a diameter of one part of a shaft transmitting rotational movement from the rotor to the mechanical linkage.

The bobbin may be used without a bush.

The permanent magnet rotor may be cylindrical or generally cylindrical. For example, the permanent magnet rotor may be an elongate structure which, in transverse cross section, is a major circular segment (herein referred to as "a flat-sided cylinder" or "'D'-shaped" or "hexagonal shape" or "multi-sided shape") and which may have a concentric hole for accommodating a shaft. The permanent magnet rotor is preferably diametrically-magnetised.

The stator may comprise two or more parts. The stator may be laminated, comprising a stack of laminations. The stator may be arranged to form a complete flux circuit around the magnet without airgaps other than between the rotor and stator poles. Laminations in the stack of laminations may be interleaved. The stator may comprise sintered magnetically-soft material. The stator core may be a rectangular ring. The stator core may be rectangular in transverse cross-section. The stator poles may be rectangular in transverse cross-section. Distal ends of the stator poles are substantially cylindrically concave.

The stator may be multi-part and the actuator may further comprise an outer collar comprising soft magnetic material which is arranged to hold parts of the stator together and provide a flux path making it less susceptible to tamper.

The stator may have concave pole faces, which can accommodate a rotor (which for example, if it is 'D'-shaped in cross section) which describes a motion which will fit within a diameter of at least 4 mm, at least 6 mm, at least 7 mm, at least 8 mm, at least 10 mm, at least 15 mm or at least 20 mm.

The stator pole may have a height of at least 4 mm, at least 6 mm, at least 7 mm, at least 8 mm, at least 10 mm, at least 15 mm or at least 20 mm.

The electricity meter may be responsive to switch between first and second states by a pulse of current of no more than 20 ms, no more than 10 ms, no more than 8 ms, no more than 5 ms or no more than 4 ms.

A connecting flux path width divided by a pole path width may be less than 50% or less than 100%, wherein the width is in the plane orthogonal to the longitudinal axis of the rotor. Width of the poles may be less than 80%, less than 90%, less than 100% or less than 110% of the diameter of the rotor. Height of the magnet may be greater than 80%, greater than 100%, greater than 120% or greater than 150% of a height of the stator pole.

Stator height in the axis of the magnet may be larger than the height of the poles and which fit within the bobbin. Connecting flux path stator height may be about the same as bobbin height.

The electricity meter may include more than two pairs of first and second contacts. For example, there may be two pairs of first and second contacts.

The mechanical linkage may be multi-part. The mechanical linkage may include a cam and at least one rack and/or at least one arm. The mechanical linkage may include at least one pivot.

BRIEF DESCRIPTION OF THE DRAWINGS

Certain embodiments of the present invention will now be described, by way of example, with reference to the accompanying drawings, in which:

FIG. 6 is an exploded view of first and second parts of the stator shown in FIG. 4;

FIG. 7 is a perspective view of the first part of the stator shown in FIG. 6;

FIG. 8 is a perspective view of the second part of the stator shown in FIG. 6;

FIG. 12a is a plan view of a first flanged bobbin;

FIG. 13a is a perspective view of the first bobbin shown in FIG. 12a;

FIG. 14a is a plan view of a second flanged bobbin;

FIG. 14b is a plan view of the second bobbin shown in FIG. 14a with a bush;

FIG. 15a is a perspective view of the second bobbin shown in FIG. 14a;

FIG. 15b is a perspective view of the second bobbin shown in FIG. 14a with a bush;

FIG. 18a is a perspective view of the third bobbin shown in FIG. 17a;

FIG. 22 is a bottom plan view of a fifth, single-piece flanged bobbin;

FIG. 23 is a top plan view of the fifth flanged bobbin shown in FIG. 22;

FIG. 24 is a perspective view of the fifth flanged bobbin shown in FIG. 22;

DETAILED DESCRIPTION OF CERTAIN EMBODIMENTS

Figure 1:
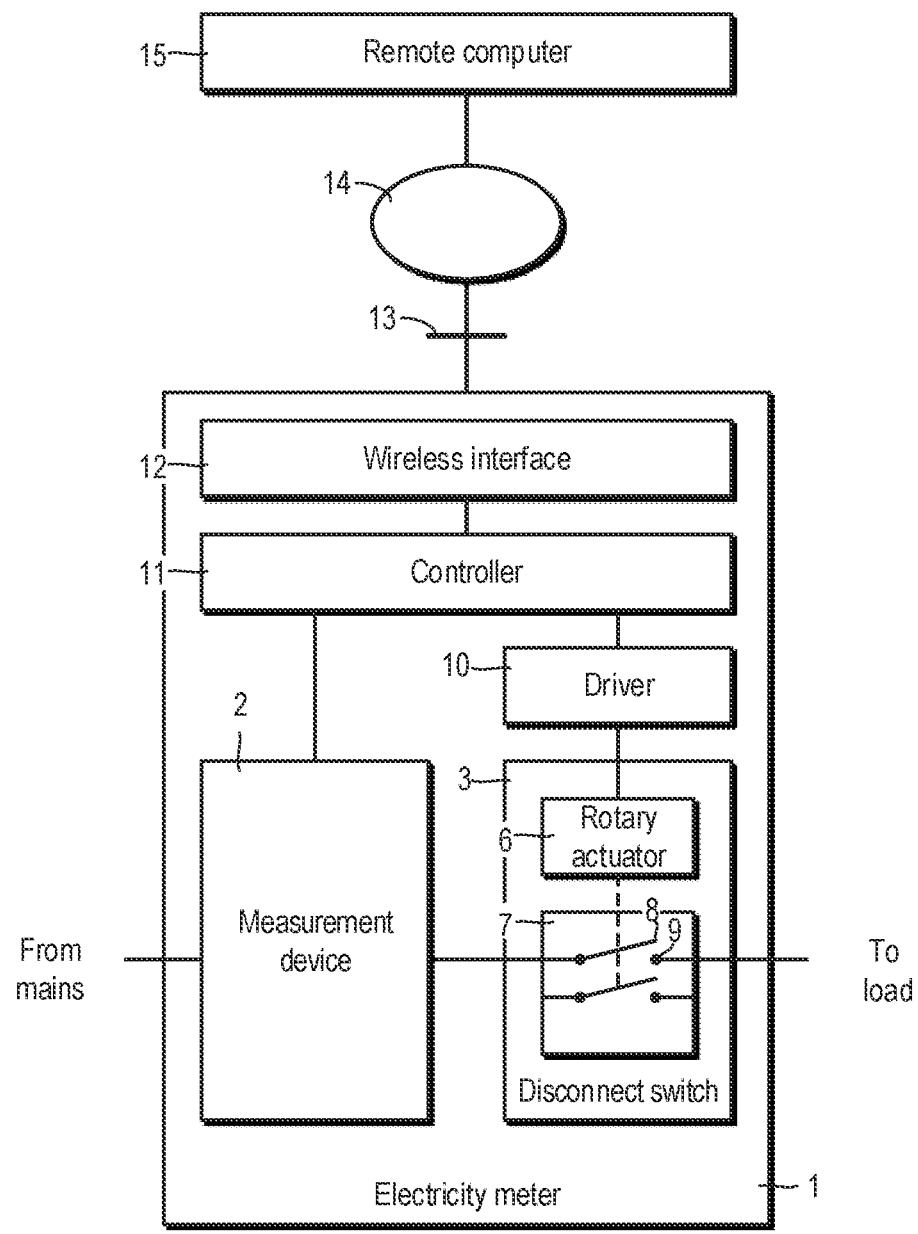
FIG. 1 is a schematic block diagram of an electricity meter which includes an electrically-controllable electromechanical switch comprising a rotary actuator.

Referring to FIG. 1, an electricity meter 1 is shown. The electricity meter 1 may take the form of a single-phase (or two-phase or three-phase for example) meter intended for domestic or commercial use. The electricity meter 1 includes a measurement device 2 for measuring the amount of electric energy consumed, and an electrically-controllable electromechanical switch 3 (herein also referred to as a "disconnect switch") for controllably connecting and disconnecting the electricity supply.

The disconnect switch 3 includes a rotary actuator 6 (which is also referred to herein simply as an "actuator") and a switch 7 in the form of double-pole, single-throw switch having first and second sets of first and second contacts 8, 9. The switch 7 can take other forms, e.g. a single-pole, single-throw switch, or a three-pole, single-throw switch. The rotary actuator 6 is operable to open and close the switch 7. The electricity meter 1 includes a driver circuit 10, a controller 11 and a wireless interface 12 to a wireless network 13, such as a mobile communication network and/or a wireless local-area network. The electricity meter 1 can communicate via the wireless network 13 and a communications network 14 (such as the Internet) with a remote computer 15. The controller 11, via the driver 10, operates the disconnect switch 3.

Figure 2:
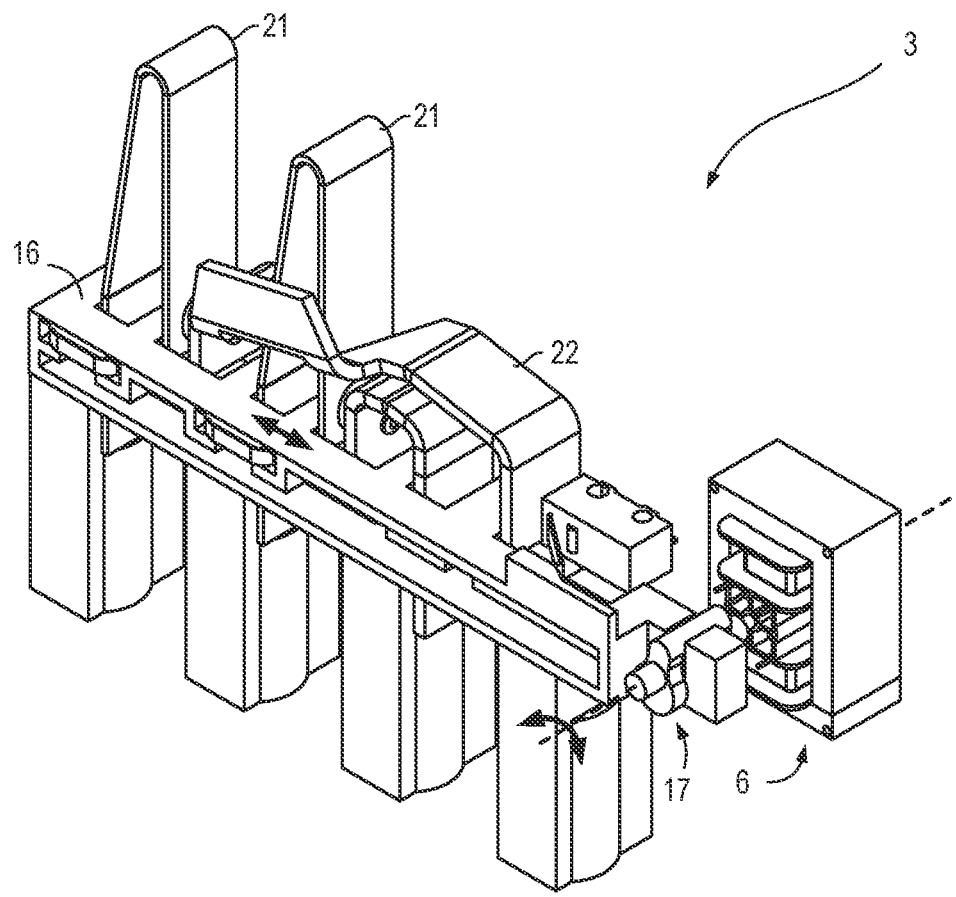
FIG. 2 is a perspective view of an electrically-controllable electromechanical switch which includes a rotary actuator.
Figure 3:
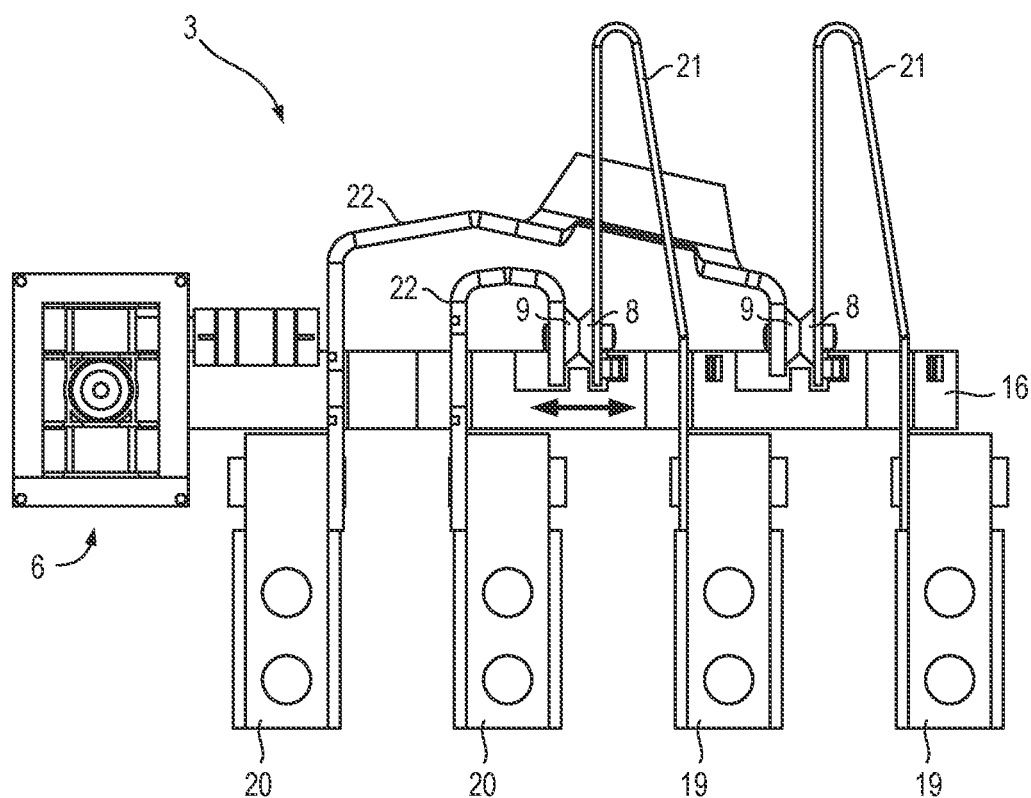
FIG. 3 is a side view of the switch shown in FIG. 2.

Referring to FIGS. 2 and 3, the disconnect switch 3 includes a rack 16 (herein also referred to as a "carrier") formed of electrically-insulating material which supports the first contact 8 and which is linearly moveable. Thus, movement of the rack 16 make and break the contacts 8, 9 (i.e., close and open the switch 7). The disconnect switch 3 also includes a cam 17 mounted to a shaft 18 of the rotary actuator 6 and linked to the rack 16. Rotation of the shaft 18 causes the rack 17 to translate back and forth and, thus, close and open the switch 7. The first and second contacts 8, 9 are connected to first and second terminal blocks respectively 19, 20 via respective metallic strips 21, 22. Coils are omitted from FIGS. 2 and 3 for clarity.

Figure 4:
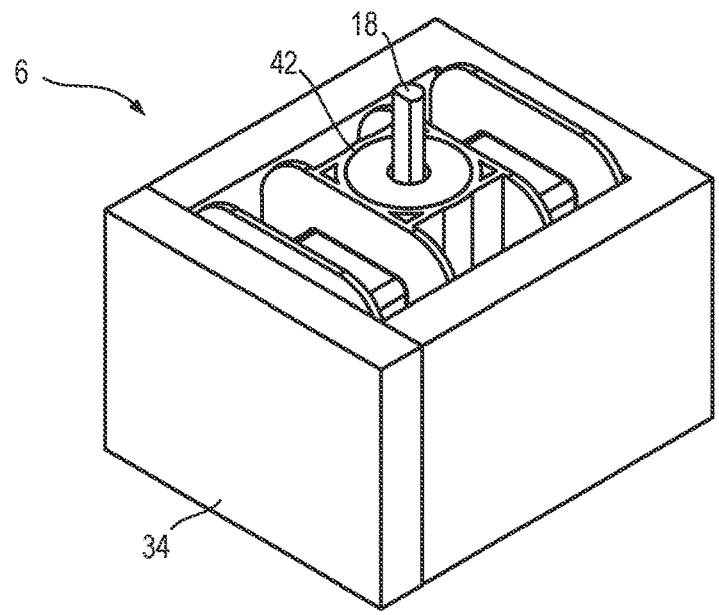
FIG. 4 is perspective view of the rotary actuator shown in FIG. 2 which includes a stator and bobbin (coils are not shown for clarity)
Figure 5:
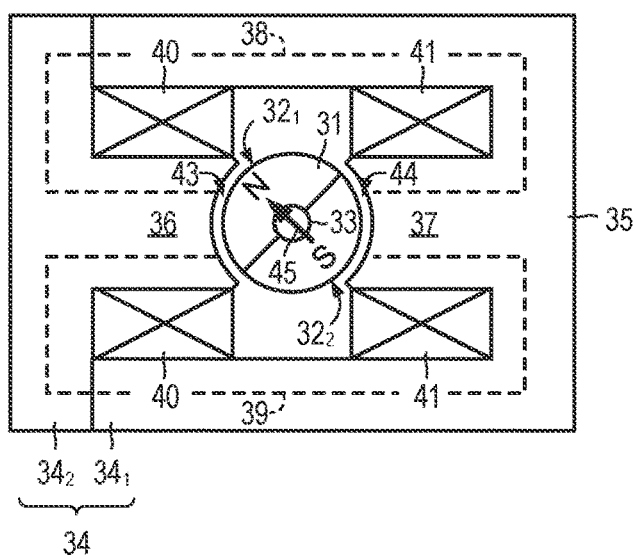
FIG. 5 is schematic view of the rotary actuator shown in FIG. 2.

Referring also to FIGS. 4 and 5, the rotary actuator 6 is arranged for bi-stable latching operation. Coils are omitted from FIG. 4 for clarity.

The rotary actuator 6 includes a cylindrical, diametrically-magnetized permanent magnet rotor 31 (herein also referred to simply as the "rotor" or "permanent magnet"). In other words, the permanent magnet rotor 31 is magnetised across its diameter such that one pole (e.g., north) is disposed on one curved side $32_1$ and the other pole (e.g., south) is disposed on the other, opposite curved side $32_2$. The permanent magnet preferably if formed from a rare-earth magnetic material, such as sintered NdFeB or SmCo. The permanent magnet rotor 31 may have a central hole 33 along its longitudinal axis. A shaft 18 may be fixed to the rotor using adhesive, or by a press fit. The shaft 18 may not be fixed to the magnet. The magnet 31 may have drive feature (s), which are used to transfer torque from the rotor to the mechanism attached, such as a cam. A sleeve (not shown) may be provided between the rotor 31 and shaft 18, bonded to the rotor 31 with the shaft 18 pressed in to the sleeve.

The rotary actuator 6 includes stator 34 comprising a closed stator core 35 for magnetic flux, and first and second opposite stator poles 36, 37 inwardly-projecting from the closed stator core 35. The stator 34 comprises magnetically soft material, i.e., a material having a high permeability, low eddy current losses, and low coercivity, such as, sintered magnetically soft iron, laminated silicon steel.

The stator 34 provides first and second connecting paths 38, 39 for magnetic flux. Multiple flux paths can help to improve efficiency and reduces the actuator vulnerability to tamper using external magnetic fields. The stator core 35 surrounds the outside diameter of the permanent magnet rotor 31.

The rotary actuator 6 also includes first and second coils 40, 41 that are wound around the first and second stator poles 36, 37 respectively. The coils 40, 41 are formed on a flanged bobbin 42.

Referring also to FIGS. 6, 7 and 8, the stator 34 comprises first and second parts $34_1$, $34_2$. As will be explained in more detail later, the rotary actuator 6 can be assembled at least in part by joining to the two parts $34_1$, $34_2$ in and around the bobbin 42.

Referring in particular to FIG. 5, the permanent magnet rotor 31 is interposed between the pole pieces 36, 37 leaving respectively air gaps 43, 44. The shape of the stator 34 can be optimised.

The rotary actuator 6 is a bi-stable actuator. When there is no current in the coils 40, 41, the axis of magnetisation 45 of the permanent magnet 31 attempts to align with the line of the poles 36, 37. Bi-stable action can be achieved with a single permanent magnet 31. End stops (not shown) can be used to restrict angle of rotation of the permanent magnet 31 and prevent complete alignment of the axis of magnetisation 45 with the poles 36, 37. Thus, the range of angles over which the actuator is free to rotate is less than 180 degrees. One end stop is provided by the electrical contacts 8, 9.

The rotary actuator 6 can be switched between its two stable positions by applying a pulse of current to the coils 40, 41 to generate a magnetic field which opposes that of the permanent magnet rotor 31 and which is sufficiently strong to overcome the latching force of the permanent magnet rotor 31.

Figure 9:
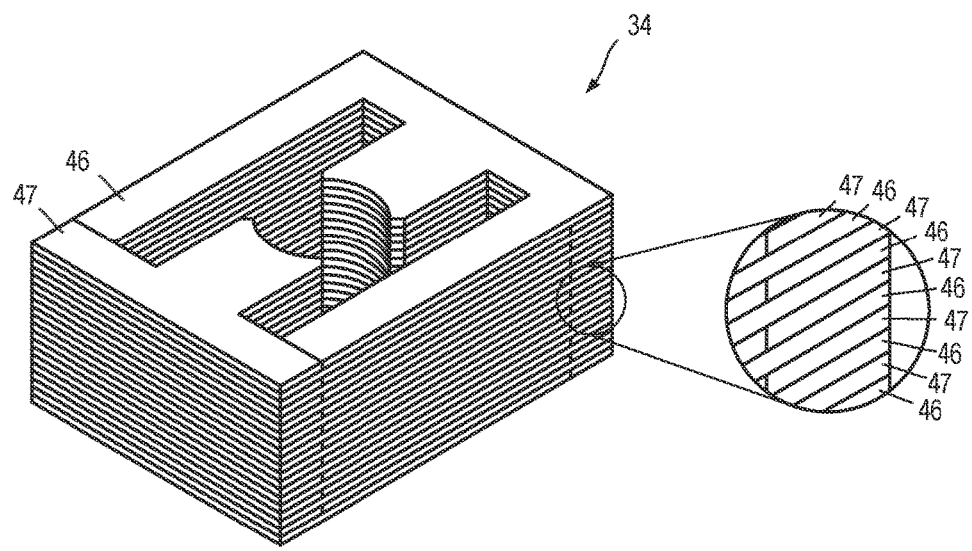
FIG. 9 is perspective view of a stator having an interleaved, laminated construction.
Figure 10:
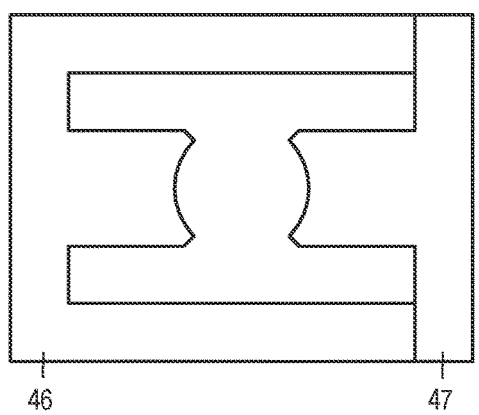
FIG. 10 is a plan view of an E-T, two-piece lamination.
Figure 11:
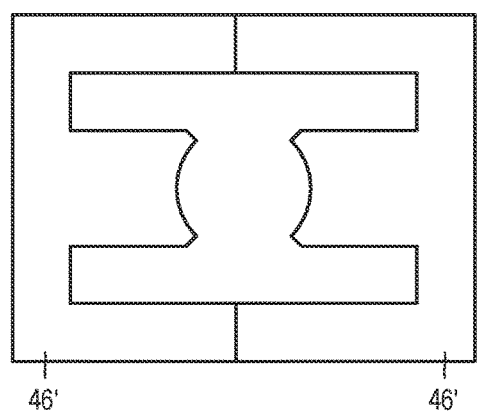
FIG. 11 is a plan view of an E-E, two-piece lamination.
Figures 12A, 13A:
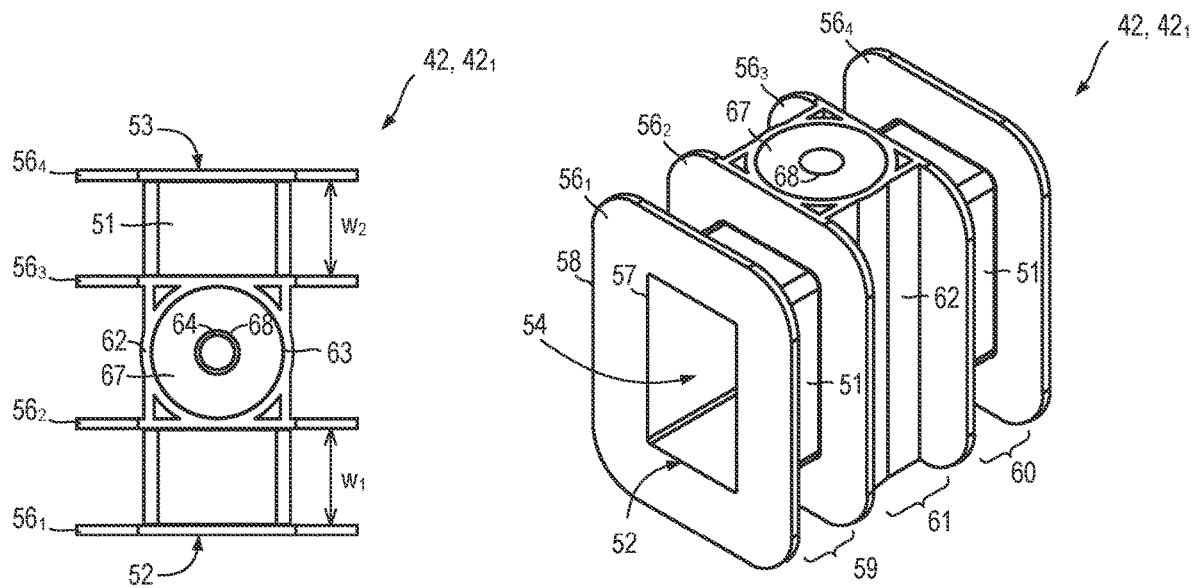
Figures 12B, 13B:
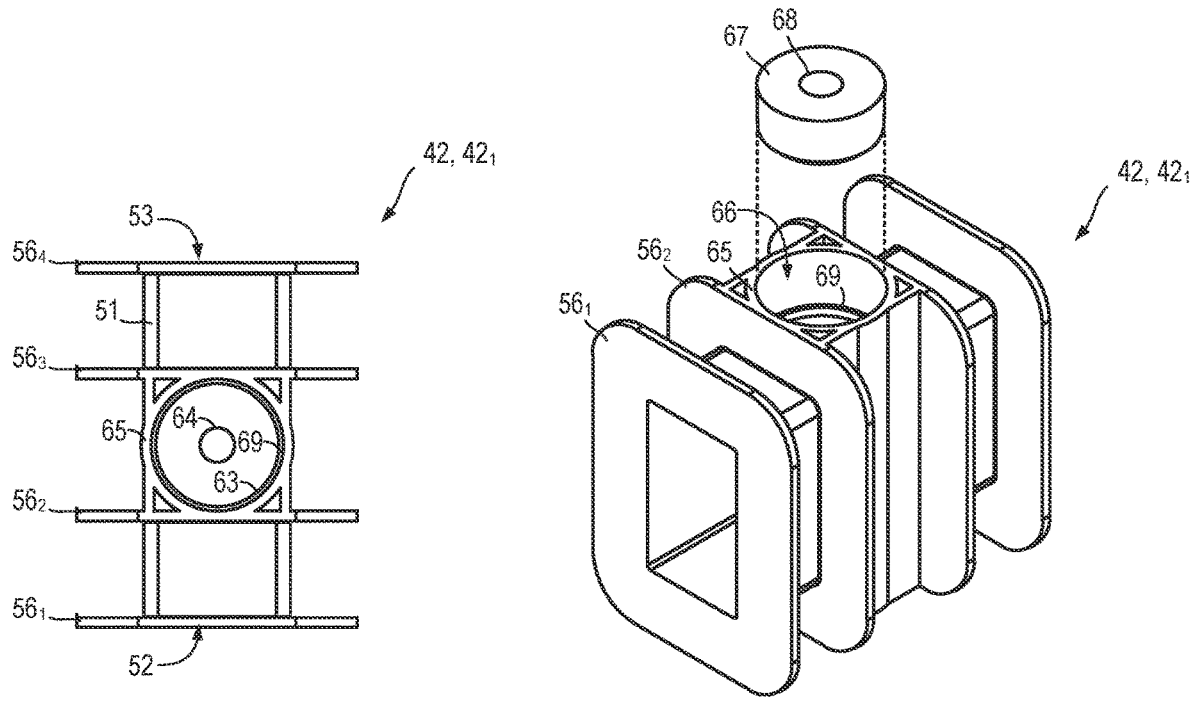
FIG. 12b is a plan view of the first bobbin shown in FIG. 12a with a bush.
FIG. 13b is a perspective view of the first bobbin shown in FIG. 12a with a bush.
Figure 16:
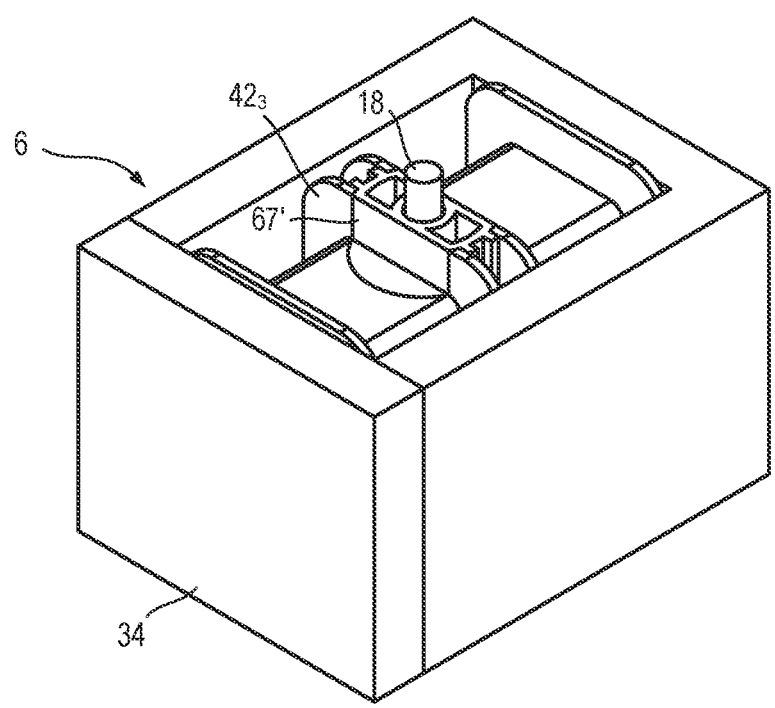
FIG. 16 is a perspective view of a rotary actuator which includes a stator and a third flanged bobbin (coils are not shown for clarity)
Figure 17A:
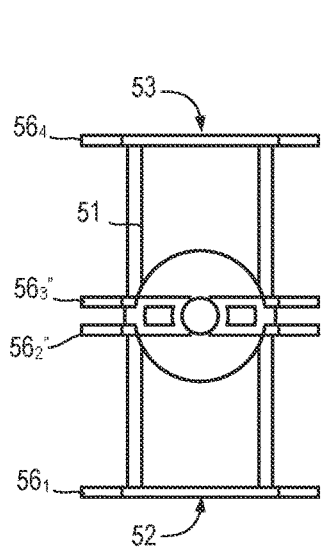
FIG. 17a is a plan view of the third flanged bobbin shown in FIG. 16.
Figure 18A:
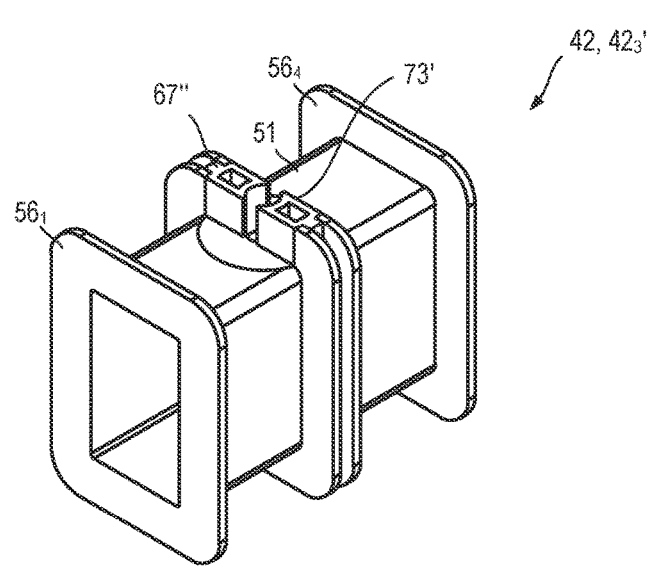
Figure 17B:
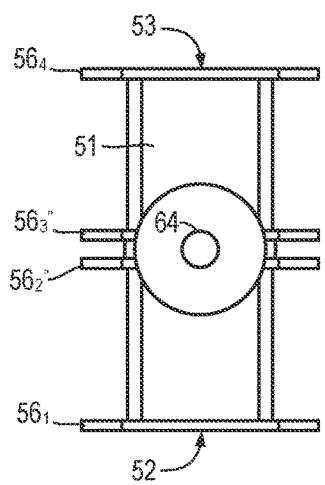
FIG. 17b is a plan view of the third bobbin shown in FIG. 17a with a bush.
Figure 18B:
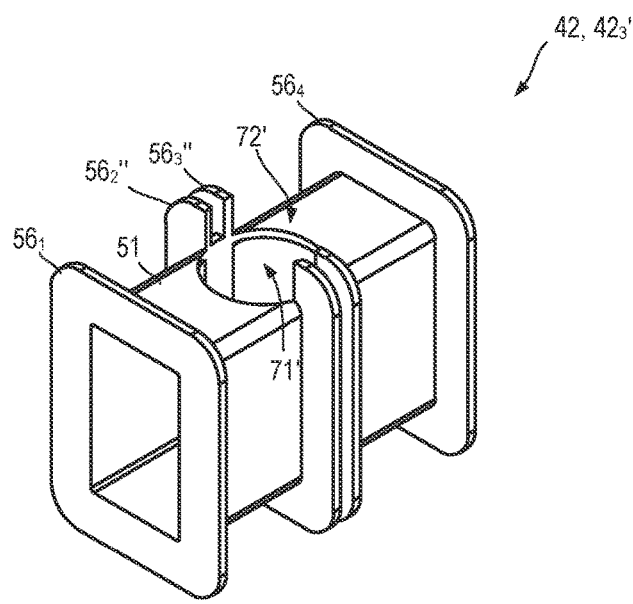
FIG. 18b is a perspective view of the third bobbin shown in FIG. 17a with a bush.

Referring also to FIGS. 9, 10 and 11, the stator 34 may be formed from a stack of laminations pairs 46, 47 formed of magnetically-soft material, such as silicon steel sheet. The lamination pairs 46, 47 comprise a first lamination 46 (or "sheet") which is 'E'-shaped and a second lamination 47 which is 'T'-shaped. The lamination pairs 46, 47 may be reversed (i.e., rotated through 180°) from one layer to the next layer resulting in a laminated structure in which the layers 46, 47 are interleaved. Other shapes of laminations can be used. For example, laminations 46' having a symmetrical 'E'-shapes may be used. Additional laminations may be used in the stack to form a shape which is equivalent to the fully-assembled stator shape illustrated in FIG. 6.

The lamination shapes shown in FIGS. 10 and 11 may be used by two parts each with a suitable height, which to fits within the bobbin 42. The aforementioned two components may be made from sintered soft material.

The fully assembled shape of stator in FIG. 6 has an advantages over the fully assembled shown in FIG. 9, as the cross section of stator's first and second connecting paths 38, 39 (FIG. 5) are increased with little change to the compactness of the actuator and therefore improving the external magnetic field tamper immunity.

Various embodiments using laminations or sintered parts may be used with any of the actuator designs.

Referring again to FIGS. 4 and 5, the actuator 6 includes a bobbin 42 which provides a former for the actuation coils 40, 41.

As explained earlier, the stator 34 is made in two or more pieces which enables a single bobbin 42 to support two sets of coils 40, 41 which are located on diametrically opposite sides of the magnet 31. This arrangement can help to reduce cost since a single bobbin 42 is used and can help to locate the magnet shaft precisely with respect to the stator poles 36, 37 and can help to ensure consistency of air gap size between the poles 36, 37 and the outer periphery 32 of the magnet 31.

Referring to FIGS. 12a, 12b, 13a and 13b, a first flanged bobbin 42, 42₁ is shown. The bobbin 42₁ is generally box-shaped (i.e., is elongate and is rectangular in cross section) and has open ends.

The bobbin 42₁ comprises a wall 51 extending between first and second open ends 52, 53. The wall 51 defines a lumen 54 comprising first, second and third sections (not shown) between the first and second ends 52, 53. The first and third sections (not shown) are configured (i.e., shaped and dimensioned) to accommodate the first and second pole pieces 36, 37 respectively. The second section (not shown) is to accommodate the rotor 31.

The bobbin 42₁ comprises first, second, third and fourth thin-walled flanges 56₁, 56₂, 56₃, 56₄ extending outwardly from the wall 51 (i.e., away from the inside of the bobbin). Inner and outer peripheries 57, 58 of the flanges 56₁, 56₂, 56₃, 56₄ are generally rectangular. The first and second flanges 56₁, 56₂ define a first section 59 having a width $w_1$ for receiving the first coil 40 (FIG. 5) and the third and fourth flanges 56₃, 56₄ define a second section 60 having a width $w_2$ for receiving the second coil 41 (FIG. 5).

In a third section 61, midway between the first and second ends, 52, 53, between the inner two flanges 56₂, 56₃ (i.e., between the second and third flanges 56₂, 56), the bobbin 42₁ includes outer side wall portions 62 which extend to the outer periphery 58 of the flanges 56₂, 56₃.

In the third section 61, the bobbin wall 51 includes a wide circular through hole 63 on one side (in this case shown to be the top side) and a circular hole 64 (or "first location hole") on the opposite side (in this case, the bottom side) which serves a first bearing for the shaft 18 (or "first location hole"). A short, inner cylindrical wall 65 extends outwardly to define a recess 66 for receiving an annular bush 67, for example, in the form of a sleeve bushing. The bush 67 includes a central through-hole 68 (or "a second location hole"). The bush 67 serves a second bearing for the shaft 18. The bush 67 may sit on an annular lip or shelf 69.

The actuator 6 has a compact configuration, exhibiting low inertia and, thus, fast operation. Fast operation reduces Joule heating resistance losses as a drive current can be applied for a short time, for example, less than 20 ms, preferably less than 10 ms and even more preferably less than 5 ms. The short operation time can help to improve efficiency of operation. The use of compact coils 40, 41 and a compact magnetic circuit can improve immunity to external magnetic fields and, thus, can help improve tamper protection. The magnetic flux density in the connecting paths 38 and 39 (FIG. 5) due to an external magnetic (tampering) field is approximately related to the square of the longest stator 34 dimension divided by the cross section of the connecting paths 38 and 39, so a compact, stocky design is preferable. This can be important as this can increase the size of the tamper magnet (not shown) required to interfere with the operation of the rotary actuator.

Referring to again to FIGS. 1 to 5, 5a and 5b, the actuator arrangement can enable a single, small magnet 31 to switch contacts 8, 9 from closed to open and from open to closed, and to maintain sufficient closing force on the contacts 8, 9 to help avoid overheating at high load currents. The stator 34 may be clamped together using external components such as springs, or it may be fixed together using welds or bonds. The bobbin 42 may provide a bearing for a shaft 18 which passes through the rotor magnet. The bobbin 42 can locate on the stator 34 and provide location for the rotor magnet's shaft 18.

Figure 5A:
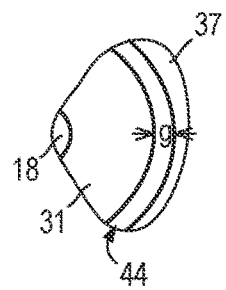
FIG. 5a illustrates an air gap in more detail.

Referring in particular to FIGS. 5 and 5a, the magnet 31 is centrally disposed within the stator 36. The minimum size, g, of the air gap 44 may be less than 2 mm, less than 1 mm or less than 0.5 mm.

Figure 5B:
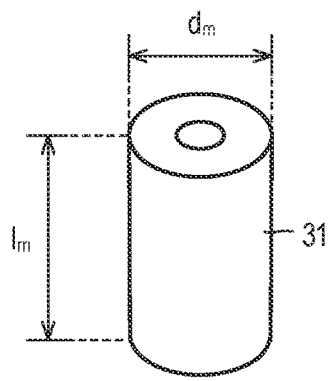
FIG. 5b is a perspective view of a permanent magnet rotor.

Referring in particular to FIGS. 5 and 5b, the diameter described by the rotor upon rotation about it longitudinal axis and/or its diameter, $d_m$, of the magnet 31 may be less than 4 mm, less than 6 mm, less than 7 mm, less than 8 mm, less than 10 mm, less than 15 mm or less than 20 mm. The axial length, $l_m$, of the magnet 31, (which may not be a whole cylinder with a hole cylindrical, e.g., it may have a slot in one end to convey torque, or flat surfaces machined on the magnet) may be less than 4 mm, less than 6 mm, less than 7 mm, less than 8 mm, less than 10 mm, less than 15 mm or less than 20 mm The permanent magnetic material and magnetic circuit are arranged to help ensure that the permanent magnet 31 maintains its magnetic properties in the demagnetising field of the actuation coils 40, 41 and the extremes of working temperature.

A bobbin 42 may be used which not only can enable alignment of the rotor 31 in the stator 34, but also to increase space available for the coils 40, 41, i.e., increase widths $w_1$, $w_2$. A higher number of windings (i.e., increased copper) can enable higher forces to be achieved for a given maximum current. Alternatively the increased space available for the coils 40,41 may enable larger diameter enamelled wire to be used than otherwise possible thus reducing resistance but with the same number of turns and same current hence the $I^2R$ (Joules Heating) losses are reduced, while maintaining the Amp turns.

Referring to FIGS. 14a, 14b, 15a and 15b, a second flanged bobbin 42, 42₂ is shown. The second bobbin 42₂ is similar to the first bobbin 42₁ except that second and third flanges 56₂', 56₃' are disposed slightly closer to the centre of the bobbin 42₂ and, on the top side, the flange 56₂', 56₃' and cylindrical wall 65' include notches 71, 72 (or "gaps") which extend from the inner periphery 57 to the outer periphery 58.

A modified bush 67' is used. The bush 67' includes a thin, disc-like base 72 and a mesa 73 upstanding from the base 72 extends across the base 72 in one direction, but is narrower in a transverse direction.

The bush 67' can be fitted after the coils are wound onto the bobbin 42₂.

Referring to FIGS. 16, 17a, 17b, 18a and 18b, a third flanged bobbin 42, 42$_3$, 42$_3$' is shown. The third bobbin 42$_3$, 42$_3$' is similar to the second bobbin 42$_2$ except that second and third flanges 56$_2$", 56$_3$" are disposed even closer to the centre of the bobbin 42$_2$ and, on the top side, the flange 56$_2$", 56$_3$" include wide notches 71', 72'. The cylindrical wall, e.g. 65 cylindrical wall (FIG. 13b) or notched cylindrical wall 65' (FIG. 15b), is not used.

The modified bush 67',67" shown in FIGS. 16, 17a, 17b, 18a and 18b can be used, but it cannot be fitted after the coils are wound onto the bobbin 42$_3$, 42$_3$'. The modified bush 67' encloses the diameter of the shaft 18, whereas the modified bush 67" does not full enclose the bush in the mesa 73' section of the modified bush 67", thus enabling more space for coils 40, 41.

Figure 19:
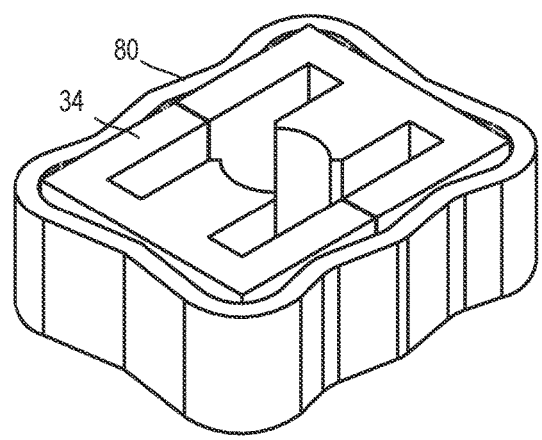
FIG. 19 is perspective view of a stator and an outer magnetically-soft band.

FIG. 19 illustrates a stator 34 and an outer band 80 of magnetically-soft material used to hold the stator 34 components together and to provide additional flux path which can help to improve further the performance of the actuator and reduce the susceptibility to tampering.

Figures 20, 21:
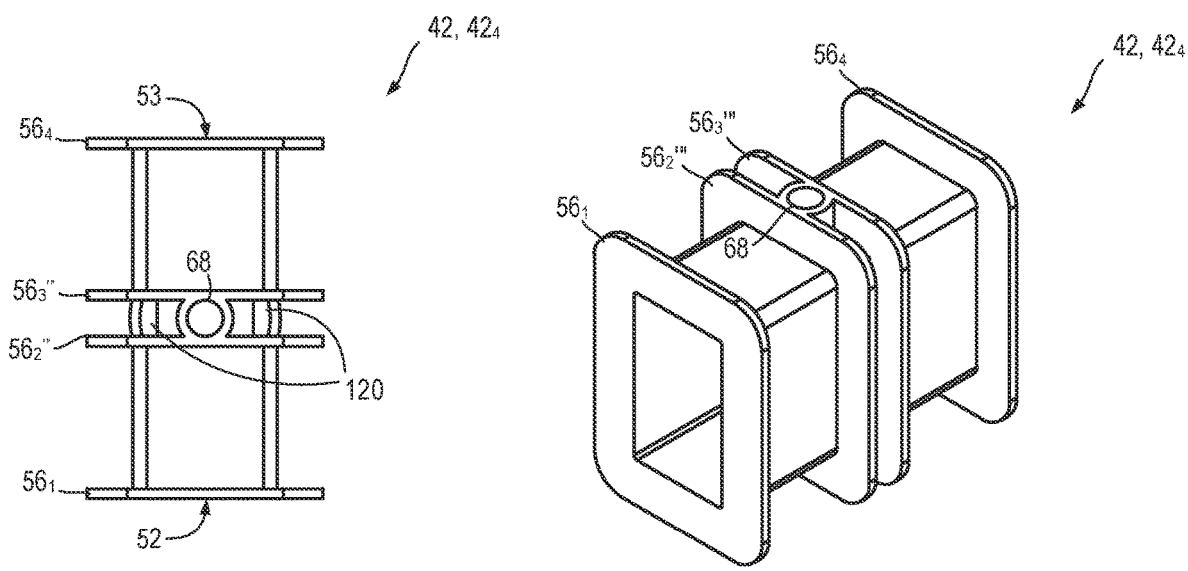
FIG. 20 is a plan view of a fourth, single-piece flanged bobbin.
FIG. 21 is a perspective view of the fourth flanged bobbin shown in FIG. 20.
Figure 25:
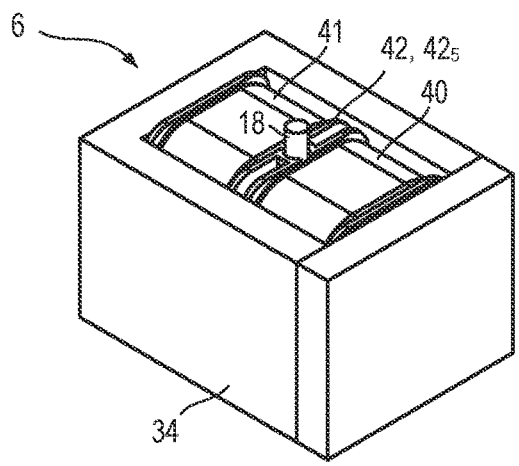
FIG. 25 is a perspective view of a rotary actuator which includes a stator and the fifth flanged bobbin shown in FIG. 20.
Figure 26:
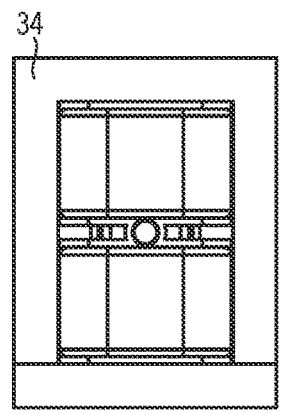
FIG. 26 is a top plan view the rotary actuator shown in FIG. 25.
Figure 27:
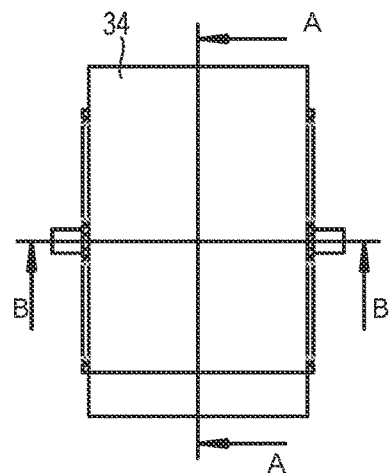
FIG. 27 is a side elevation view the rotary actuator shown in FIG. 25.
Figure 28:
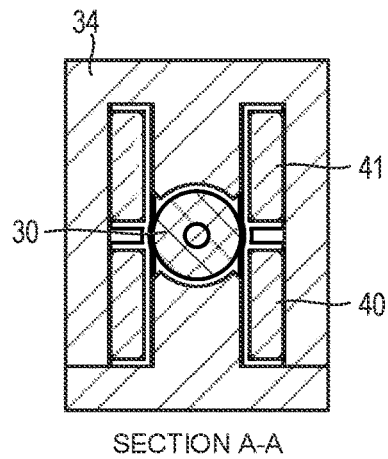
FIG. 28 is a cross-sectional view taken along the line A-A shown in FIG. 27.
Figure 29:
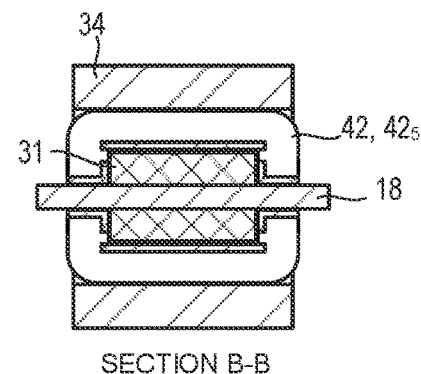
FIG. 29 is a cross-sectional view taken along the line B-B shown in FIG. 27.

Referring to FIGS. 20 and 21, a fourth flanged bobbin 42, 42$_4$ is shown. The bobbin 42$_4$ is single piece, i.e., a separate bush, e.g. simple bush 67 (FIG. 13a) or modified bush 67' (FIG. 15a), is not used.

The single-piece bobbin 42$_4$ provides increased space for coils 40, 41 (FIG. 1). The bobbin has location holes 64, 68 for the cylindrical magnet's shaft 18 (FIG. 4). The bobbin 42$_4$ may be wound and the magnet 31 fitted at the same time as the stator 34 (FIG. 5) is fitted. The shaft 18 or torque transmission device is fitted afterward (e.g., key, force fit, adhesive etc.).

Referring to FIGS. 22, 23 and 24, a fifth flanged bobbin 42, 42$_5$ is shown. Similar to the fourth bobbin 42$_4$ (FIG. 20), the fifth bobbin 42$_5$ is single piece, i.e., a separate bush is not used.

The single-piece bobbin provides increased space for coils 40, 41 (FIG. 1). The bobbin has location holes 64, 68 for the cylindrical magnet's shaft 18 (FIG. 4). The bobbin 42$_4$ can be wound and the magnet 31 fitted at the same time as the stator 34 (FIG. 5) is fitted. The shaft is fitted afterward (e.g., key, force fit, adhesive etc.).

Bobbin 42$_5$ second and third flanges 56$_2$"''', 56$_3$"''' include notches 91, 92. In addition the bobbin 42$_5$ and bobbin 42$_4$ (FIG. 20) has relief features 120$_1$ which penetrates from the top to bottom side of the bobbin, which provide additional clearance for the rotor 31. Similar relief features 120 are shown on bobbin 42$_4$.

Referring to FIGS. 25, 26, 27, 28 and 29, a rotary actuator 6 which includes the fifth bobbin 42, 42$_5$ is shown.

Figure 32A:
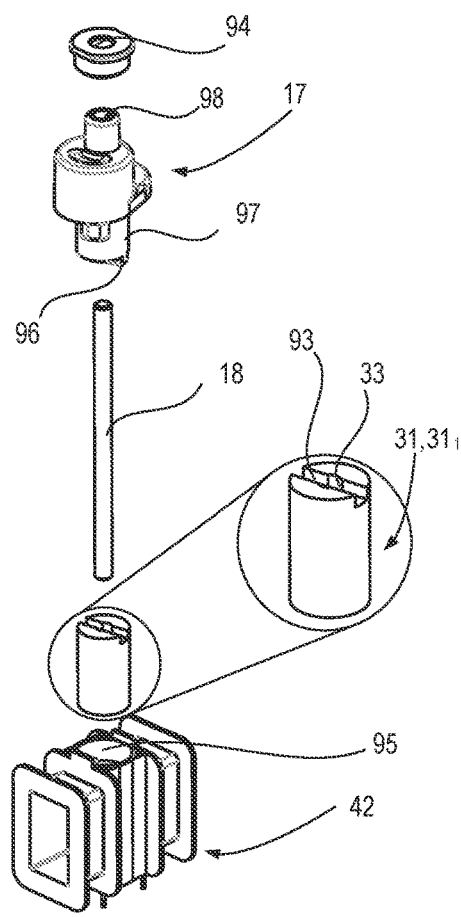
FIG. 32a is an exploded view of a partial actuator arrangement.
Figure 32B:
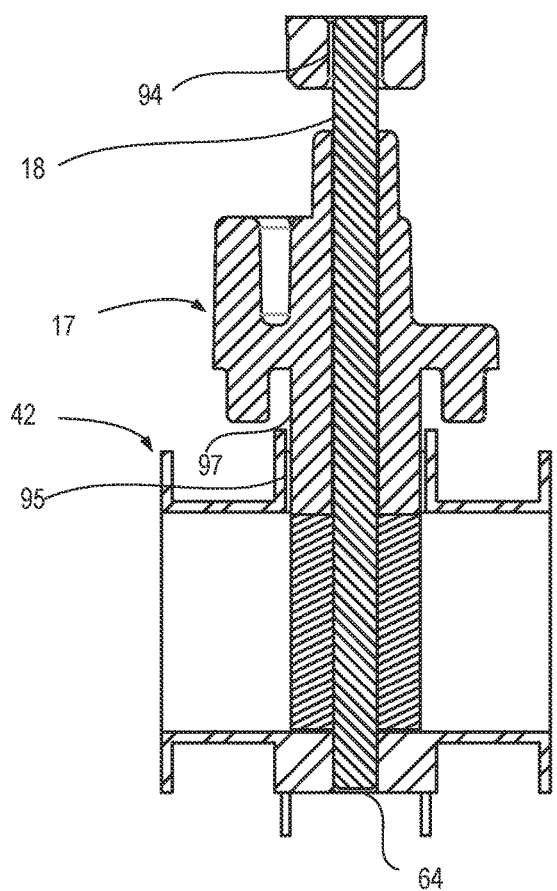
FIG. 32b is a cross section of an assembled partial actuator arrangement.

FIG. 32a is an exploded view of a partial actuator arrangement, and FIG. 32b is a cross section (taken through the centre axis of the shaft 18 in a plane aligned with the longitudinal axis of the bobbin 42) of the assembled partial actuator arrangement. Referring to FIGS. 32a and 32b a cam 17 has a male feature 96 which engages in the slot 93 (or female feature) of the rotor 31, 31$_1$. The shaft 18 is located in a hole 98 in the cam 17, the shaft 18 is located in a hole 33 in the rotor 31. Various means of locating the rotor 31 may be provided. The through hole 64 in the bobbin 42 may provide a bearing and/or location for shaft 18. The hole 64 may be replaced by a blind hole which will provide radial location for the shaft 18, and may additionally provide axial location for the shaft 18. An additional location and/or bearing for the rotor may be provided by a hole 94 in a component such as a cover (not shown) or a bush (shown). If the hole 94 is not used or available the cam 17 may have a surface 97 which locates and/or bears on the surface of a hole 95 provided in the bobbin 42.

The hole 33 may have a key or be 'D'-shaped in transverse cross section to mate with a correspondingly-shaped shaft 18.

Figures 33A, 33B:
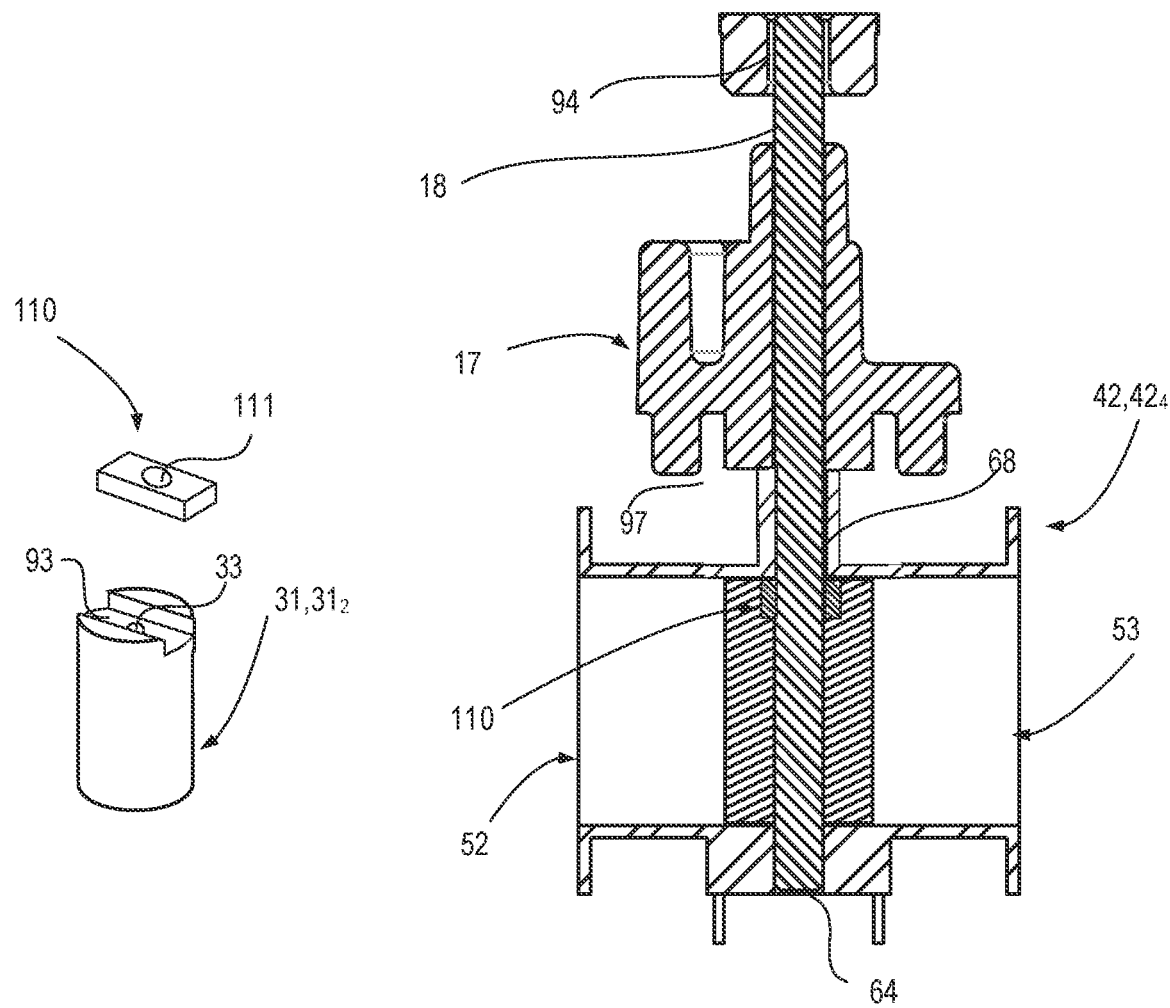
FIG. 33a is an exploded view of a magnet and driven block.
FIG. 33b is a cross section of an assembled partial actuator arrangement.

FIG. 33a is an exploded view of a the magnet 31$_2$, which has slot 93 and hole 33, and a driven block 110 which fits in the slot 93 of the magnet 31$_2$ further the driven block 110 may have a hole 111 which may be keyed (e.g. "D" shape) and or a force fit with the shaft 18. The shaft 18 may be stepped and keyed along its length to suit the assembly process. It may not protrude from the top of the cam 17 unless optional hole 94 is used. FIG. 33b shows a cross section (taken through the centre axis of the shaft 18 in a plane aligned with the longitudinal axis of the bobbin 42, 42$_4$) of a partial assembled actuator arrangement (windings 40 and 41 not shown). The cam 17 may be fixed to the shaft 18 by moulding, key or other means. The magnet 31$_2$ and driven block are loaded in to the bobbin 42,42$_4$ using either of the first and second open ends 52, 53. This may be be completed when the stator 34 (not shown) is assembled. The shaft 18 is assembled through hole 68 to engage in the hole 111 of the driven block 110. The shaft 18 is thus locked to the driven block and the cam, and uses the bearing surface of hole 68. The through hole 64 in the bobbin 42 provides a bearing and/or location for shaft 18. The hole 64 may be replaced by a blind hole which will provide radial location for the shaft 18, and may additionally provide axial location for the shaft 18. As an option either or both of the holes 64 and 68 may be supplied by bushes located in the bobbin 42. As an option an additional location and/or bearing for the rotor may be provided by a hole 94 in a component such as a cover (not shown) or a bush (shown).

Any of the bobbins 42 may have notches 71 suitably positioned in any of the flanges 56 to ease winding of the coils and increase the packing density of the coils. In addition any of the bobbins may have mould features to house terminal pins for the windings.

It is often important that the rotary actuator 6 is aligned to the mechanical linkage 16 which operates the moveable contact(s) 8. The bobbin 42 may have moulded features to enable the aforementioned alignment, which is beneficial as the bobbin 42 can determine the alignment of the shaft 18 and cam 17 if used, thus reducing the overall tolerance stack, and reducing costs of manufacture. The stator 34 can also be used to obtain the aforementioned alignment.

The rotary actuator 6 can be used to drive a variety of mechanical linkages which turn the actuator's rotation in to a motion to open and close the contact(s) 8,9.

The two inner flanges 56$_2$ and 56$_3$ can be integrated in to a single central flange. The sides of the central flange can at least partially support the coils 40 and 41.

The rotor 31 may not have a through hole 33, as an alternative it may have blind hole(s), no holes if the outer diameter or other external male feature of the rotor is/are used to locate the rotor e.g. the rotor 31 can use external features to locate it in the bobbin 42 at the distal end, and a slot 93 at the other end into which is fitted a driven block 110 with hole 111. The driven block 110 may be bonded to the magnet and hole 111 may be used to provide location for the other end of the rotor 31.

The bobbin 42 may not have a hole 64, instead of the hole 64 the bobbin 42 may have a boss (not shown) with diameter and height suitable for the location of the rotor 31 using its hole 33, alternatively the bobbin 42 may have a counter bore (not shown) which provides location on the outer diameter of the magnet.

The form of the bobbins 42 disclosed may be made from a number of parts.

Drive

Figure 30:
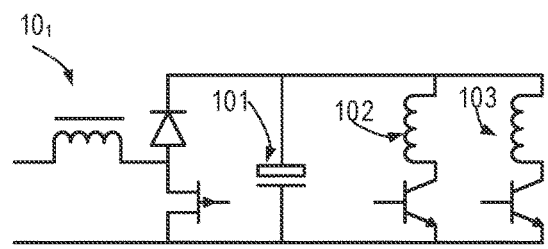
FIG. 30 is a schematic circuit diagram of a first driver circuit and actuator coils.
Figure 31:
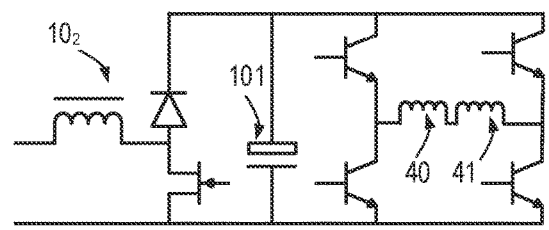
FIG. 31 is a schematic circuit diagram of a second driver circuit and actuator coils.

Referring to FIGS. 30 and 31, the charging circuits $10_1$ and $10_2$ are provided with an input power supply (not shown).

Referring to FIG. 31, an actuation current may be provided by discharging a capacitor 101 through a coil(s) 40, 41. The Actuation direction may be reversed by reversing the direction of the current. The coils 40 and 41 are two coils in series and can have no centre tapping.

Referring to FIG. 31, an actuation current may be provided by discharging a capacitor 101 through a coil(s) 102 or a coil(s) 103. The bobbin 42 is wound to have a centre tapping(s) with clockwise 102 and anti-clockwise 103 windings. The clockwise 102 and anti-clockwise windings 103 may be distributed evenly in the sections 59 and 60 of the bobbin 42, or for example all of the clockwise windings 102 may be would in section 59, and all of the anti-clockwise windings 103 may be wound in section 60. Other distributions of windings can be used to achieve similar performance. This design uses more power than the arrangement in FIG. 30, as only half the turns are used at one time, but it reduces the drive circuit complexity.

Some of the bobbin embodiments allow more space for windings which enable reduced energy usage to operate the actuator and so reduces the cost of the drive circuit e.g. size of the capacitor.

If a suitable input power supply is used the circuit may be operated without the charging circuit $10_1$, $10_2$.

MODIFICATIONS

It will be appreciated that various modifications may be made to the embodiments hereinbefore described. Such modifications may involve equivalent and other features which are already known in the design, manufacture and use of electrically-controlled electromechanical switches and electricity meters and component parts thereof and which may be used instead of or in addition to features already described herein. Features of one embodiment may be replaced or supplemented by features of another embodiment.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. An electricity meter comprising an electrically-controlled electromechanical switch comprising:
    a two-airgap, bi-stable rotary actuator comprising:
        a permanent magnet rotor having a central axis;
        a stator comprising a closed stator core around the central axis and first and second opposite stator poles inwardly-projecting from the closed stator core towards the rotor defining first and second airgaps; end stops including an end stop provided by an electrical contact; and
        first and second coils wound around the first and second stator poles respectively; and
    a switch comprising at least one pair of first and second contacts, wherein a first contact is movable; and
    a mechanical linkage between the rotary actuator and the movable contact(s) configured such that rotation of the rotor from a first angular position to a second angular position causes the switch to be opened, and rotation from the second angular position to the first angular position causes the switch to be closed;
    wherein the rotor is rotatable between first and second stable positions, the end stops restrict angle of rotation of the rotor and prevent complete alignment of rotor with the stator poles which are separated by 180 degrees;
    wherein the rotor is latched at the first and second stable positions and is latched when no current flows through the first and second coils;
    wherein the electricity meter further comprises:
        a bobbin comprising:
            a wall extending between first and second ends defining a lumen including first, second and third sections between the first and second ends, wherein the first and second sections are for receiving the first and second stator poles respectively through respective first and second openings at the first and second ends respectively, and wherein the third section is interposed between the first and second sections for receiving the rotor, introducible through the first or second openings or through an optional third opening in the wall of the bobbin; and
            first, second, and third flanges and, optionally, a fourth flange spaced apart between the first and second ends defining fourth and fifth sections for forming the first and second coils.

2. The electricity meter of claim 1, wherein the bobbin is single-piece.

3. The electricity meter of claim 1, wherein the bobbin is configured to partly or fully position the rotor with respect to the first and second stator poles.

4. The electricity meter of claim 1, wherein the bobbin is configured to directly or indirectly position the rotor with respect to the first and second stator poles.

5. The electricity meter of claim 1, wherein the bobbin is configured to provide a bearing for a shaft for the rotor or optionally two bearings.

6. The electricity meter of claim 1, further comprising:
    a bush,
    wherein the third opening is configured to receive the bush such that, after the rotor is disposed in the third section, the bush plugs the third opening and provides a bearing for the shaft for the rotor.

7. The electricity meter of claim 1, wherein the coil(s) partly overlap(s)/enclose(s) the air gap.

8. The electricity meter of claim 1, wherein the coil(s) partly overlaps/encloses the magnet.

9. The electricity meter of claim 6, wherein the bush comprises a disk-shaped base having a diameter and a mesa having a width narrower than the diameter extending across the base and wherein the mesa has first and second sides and the second and third flanges inner two of four include first and second gaps and the first and second sides of the mesa is configured so it may at least partly fill the gaps.

10. The electricity meter of claim 1, wherein the third and second flanges inner two of four are separated by at least a diameter of one part of a shaft transmitting rotational movement from the rotor to the mechanical linkage; or wherein the second flange inner one of three is at least as wide as the diameter of one part of a shaft transmitting rotational movement from the rotor to the mechanical linkage.

11. The electricity meter of claim 1, wherein the stator is multi-part; and
   wherein the actuator further comprises:
      an outer collar comprising soft magnetic material which is arranged to hold parts of the stator together and provide a flux path making it less susceptible to tamper.

12. The electricity meter of claim 1, wherein the stator has concave pole faces, which will accommodate a rotor which will describe a motion which will fit within a diameter having one of the following values: either at least 4 mm, at least 6 mm, at least 7 mm, at least 8 mm, at feast 10 mm, at least 15 mm or at least 20 mm.

13. The electricity meter of claim 1, wherein the stator pole has a height having one of the following values: either at least 4 mm, at least 6 mm, at least 7 mm, at least 8 mm, at least 10 mm, at least 15 mm, or at least 20 mm, wherein the height is parallel to the longitudinal axis of the rotator.

14. The electricity meter of claim 1, wherein the electricity meter is responsive to switch between first and second states by a pulse of current having one of the following values: either no more than 20 ms, no more than 10 ms, no more than 8 ms, no more than 5 ms, or no more than 4 ms.

15. The electricity meter of claim 1, wherein a connecting flux path width divided by a pole path width is one of the following percentages: either less than 50% or less than 100%, wherein the width is in the plane orthogonal to the longitudinal axis of the rotator.

16. The electricity meter of claim 1, wherein the width of the poles is one of the following percentages: either less than 80%, less than 90%, less than 100%, or less than 110% of the diameter of the rotor.

17. The electricity meter of claim 1, wherein the height of the magnet is one of the following percentages: either greater than 80%, greater than 100%, greater than 120%, or greater than 150% of a height of the stator pole.

18. The electricity meter of claim 1, wherein the stator height in the axis of the magnet may be larger than the height of the poles and which fit within the bobbin.

19. The electricity meter of claim 1, wherein the connecting flux path stator height is substantially the same as the height of the bobbin.

20. The electricity meter of claim 1, wherein the second and third flanges are integrated in a single flange.

21. The electricity meter of claim 1, wherein the bobbin is multi-piece.

* * * * *